US012743568B2

(12) United States Patent
El-Zein et al.

(10) Patent No.: US 12,743,568 B2
(45) Date of Patent: Sep. 22, 2026

(54) EARLY POWER ESTIMATION ON A DERIVED PHYSICAL HIERARCHY IN CHIP DESIGN

(71) Applicant: International Business Machines Corporation, Armonk, NY (US)

(72) Inventors: Ali S. El-Zein, Austin, TX (US); Robert James Shadowen, Austin, TX (US); Gabor Bobok, Niskayuna, NY (US); Edward Armayor McQuade, Granite Springs, NY (US)

(73) Assignee: International Business Machines Corporation, Armonk, NY (US)

(*) Notice: Subject to any disclaimer, the term of this patent is extended or adjusted under 35 U.S.C. 154(b) by 444 days.

(21) Appl. No.: 17/983,541

(22) Filed: Nov. 9, 2022

(65) Prior Publication Data

US 2024/0152676 A1 May 9, 2024

(51) Int. Cl.
*G06F 30/3308* (2020.01)
*G06F 30/31* (2020.01)

(52) U.S. Cl.
CPC .......... *G06F 30/3308* (2020.01); *G06F 30/31* (2020.01)

(58) Field of Classification Search
CPC ............................ G06F 30/3308; G06F 30/31
USPC .......................................................... 716/102
See application file for complete search history.

(56) References Cited

U.S. PATENT DOCUMENTS 6,505,328 B1 1/2003 Van Ginneken
7,143,367 B2 11/2006 Eng
7,873,927 B1 1/2011 Knol
8,261,220 B2 * 9/2012 Wu ...................... G06F 30/392 716/108
8,397,190 B2 3/2013 Kenney
8,572,532 B1 * 10/2013 Singh ...................... G06F 30/39 716/108
9,250,951 B2 2/2016 Haikney
9,411,912 B1 8/2016 Sood
10,891,411 B2 1/2021 Nam
11,907,630 B1 * 2/2024 Gupta ................... G06F 30/337
2005/0050488 A1 * 3/2005 Keller ..................... G06F 30/33 716/106
2005/0071787 A1 * 3/2005 Koga ...................... G06F 30/30 716/103
2005/0143966 A1 * 6/2005 McGaughy ........... G06F 30/367 703/3
2007/0174522 A1 7/2007 Lee
2009/0241082 A1 9/2009 Amundson (Continued)

FOREIGN PATENT DOCUMENTS

KR 100745674 B1 8/2007

*Primary Examiner* — Suchin Parihar
(74) *Attorney, Agent, or Firm* — Onyx IP Group

(57) ABSTRACT

A process is described to allow an early power estimate where switching activity provided by a simulation of a logical hierarchy in a chip design is accomplished by mapping ports in the physical hierarchy to ports in a logical hierarchy after hierarchy manipulation has been done. Power estimation is done using the switching activity from the simulation of the logical hierarchy mapped to the ports of the physical hierarchy. Early power estimation using results of the hierarchy manipulation is better than power estimation on the logical hierarchy because blocks and signals in the logical hierarchy may be replicated or merged during the hierarchy manipulation.

9 Claims, 6 Drawing Sheets

(56) References Cited

U.S. PATENT DOCUMENTS

2011/0131540 A1* 6/2011 Wu ..................... G06F 30/3315
716/108
2017/0351785 A1* 12/2017 Dhanwada ............ G06F 30/373
2021/0165856 A1* 6/2021 Kazda ................... G06F 30/398
2025/0124202 A1* 4/2025 El-Zein ................. G06F 30/394

* cited by examiner

EARLY POWER ESTIMATION ON A DERIVED PHYSICAL HIERARCHY IN CHIP DESIGN

BACKGROUND

As semiconductor chips, hereinafter simply referred to as chips, have gotten far denser modern hardware designs are typically hierarchy with functionality encapsulated as nodes in a hierarchy arrangement. The hierarchy arrangement comprises a logical hierarchy and a physical hierarchy. The logical hierarchy may not map optimally to a two dimensional layout solution as the logical hierarchy does not consider layout information, such as area and routing constraints. Efforts in automatically mapping logical hierarchy to physical hierarchy have failed due to the difficulty in performing pin optimization, pin cloning, early power estimation, and many other aspects. This is further complicated by the fact that the hierarchy transformation can be applied multiple times and possibly on different levels of hierarchy. Functional simulation is done on the logical hierarchy, which may comprise VHDL (VHSIC Hardware Description Language, where VHSIC is an acronym for Very High-Speed Integrated Circuits) down to combinatorial logic.

SUMMARY

An early power estimate can be made from a logical hierarchy and switching activity is recorded on ports of the logical hierarchy from a simulation. Hierarchy manipulation is performed with layout and performance in mind by a designer to make a physical hierarchy. The early power estimate is made after simulation of the logical hierarchy and hierarchy manipulation but prior to a final power calculation done after final placement and wiring are done. Ports in the physical hierarchy are mapped to ports in the logical hierarchy and an early power estimate can be made using the switching activity on the logical hierarchy mapped to ports in the physical hierarchy.

Later, a final power calculation is made when a chip design is complete, and all placement and wiring is known. However, a designer would also like an early power estimate when a physical hierarchy has been created. Described herein is a process that enables taking a physical hierarchy node along with switching activity specified in a switching activity file generated from simulating the logical hierarchy and mapping the switching activity to each physical hierarchy port. This will enable early power estimation for the chip. Modern chips are generally designed using a hierarchy process. Chip design generally utilizes hierarchy manipulation to automatically generate a physical hierarchy from a logical hierarchy.

DETAILED DESCRIPTION

Figure 1:
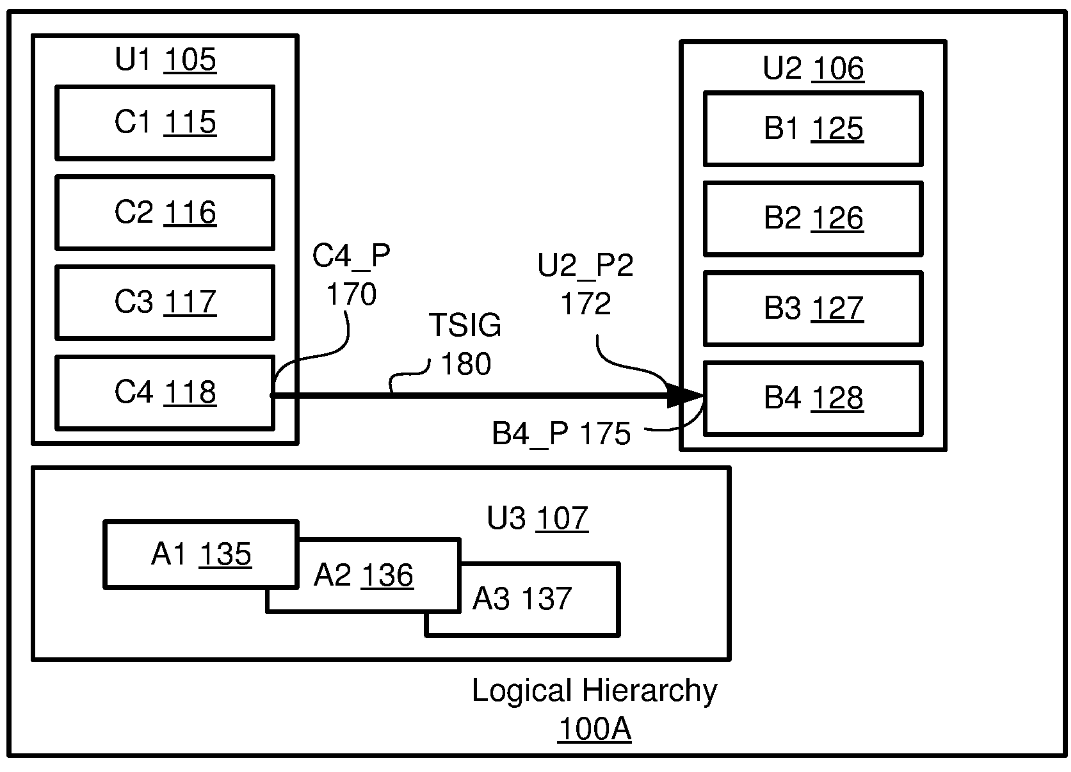
FIG. 1 shows a block diagram of a logical hierarchy and a physical hierarchy, with blocks in the logical hierarchy moved in the physical hierarchy.
Figure 1:
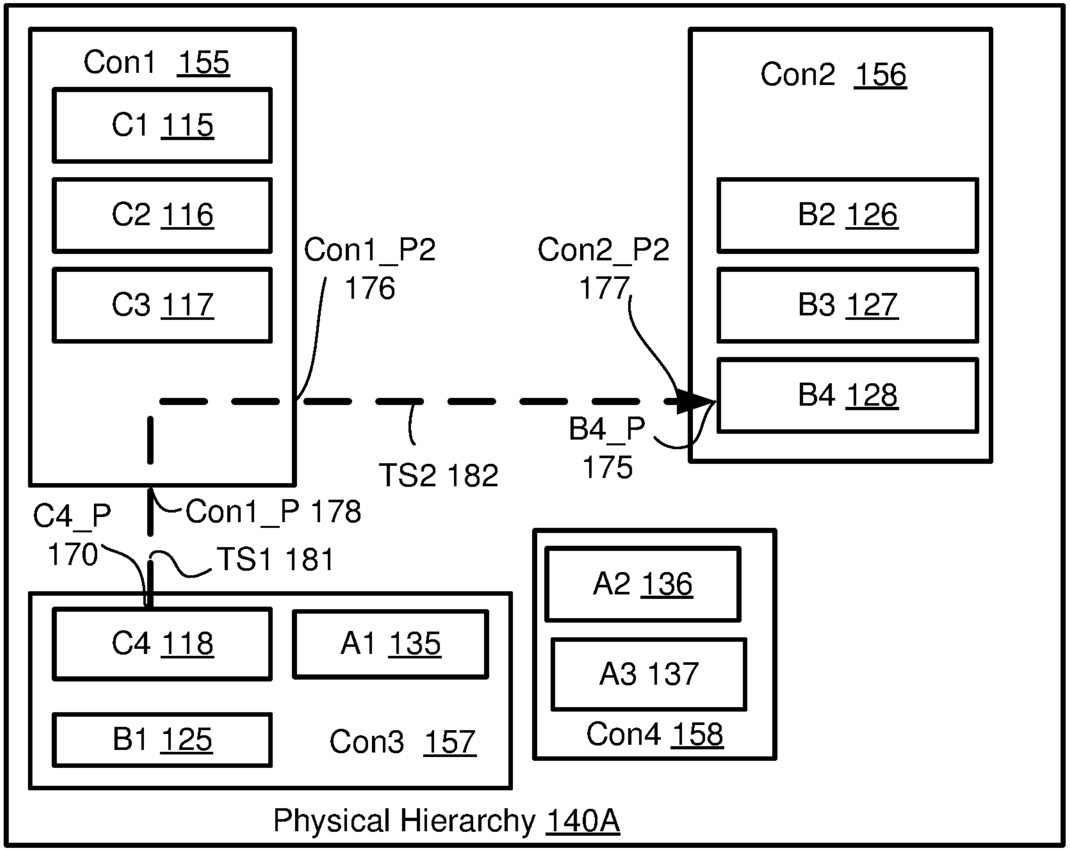

The present disclosure generally relates a process for early power estimation on a chip where simulation is done on a logical hierarchy to provide switching activity, and hierarchy manipulation has created a physical hierarchy from the logical hierarchy.

Descriptions of some functions and blocks are in order to define terms in this detailed description.

Atomic blocks: At low levels of hierarchy there are design modules that cannot be broken up into smaller pieces. For example, blocks such as combinational logic and latches are atomic blocks. These are optimized by logic synthesis and referred to as atomic blocks because hierarchy manipulation cannot split them. These atomic blocks are integrated together at higher levels of hierarchy called units sometimes called "wrappers". These units may be large synthesizable objects, units, or chiplets.

Hierarchy manipulation: A tool that performs hierarchy manipulation, which takes a logical hierarchy and, under a set of instructions grouped under a recipe file, creates a physical hierarchy.

Recipe file: A recipe file is a set of instructions that tells a hierarchy manipulation how to generate a physical hierarchy from an object (unit or atomic block) in a logical hierarchy. The recipe file has instructions such as, but not limited to, moving an instance of an atomic block or a unit from a first unit in a logical hierarchy to a first unit in a physical hierarchy; flattening a particular hierarchy; creating a new unit; and cloning (copying) an instance of an atomic block or unit.

Logical hierarchy is the design VHDL (acronym defined earlier) written by a design team; thus, the logical hierarchy is organized by function or ownership as the design team wishes. Logical hierarchy is without regard to physical layout, and, to a certain extent, timing, or power considerations. Logical hierarchy is typically a purely functional design and is what a verification team spends most of its resources on. A verification team provides switching activity at ports of the logical hierarchy to prove the logical hierarchy provides a correct implemented function. In the logical hierarchy it makes sense to group things in units such as an IFU (instruction fetch unit), a VSU (vector scalar unit), or an LSU (load store unit).

Physical hierarchy maintains the function of the logical hierarchy but reorganized for the needs of physical design. So, for example, floor planning blocks may contain logic for different logical units, replicated logic for timing/power needs, and the like as well as suitably fitting on a square or rectangular chip. In a physical hierarchy, physical proximity and not functionality dictates what structures should be placed close to each other, so it makes sense to take parts of different units and place them together in new wrappers that are called "continents" herein. To perform power estimation, it is required to know what physical block ports receive the switching activity at ports of the logical hierarchy and resultant port switching activity at all ports of blocks in the physical hierarchy.

A top level hierarchy interface (ports) does not change between a top level logical hierarchy and a corresponding top level physical hierarchy. Therefore, if a top level port is reached, switching activity for that port is known from switching activity on that port in the simulation of the logical hierarchy.

A NDB (name database) contains a record of all transforms that a HM (hierarchy manipulation) has applied when creating the physical hierarchy and enables translation of names between the logical hierarchy and physical hierarchy. Because hierarchy manipulation may be done in many separate and multiple steps, the NDBs from all the hierarchy manipulation runs may be merged to provide end-to-end translation between the logical hierarchy and the final physical hierarchy.

Figure 2:
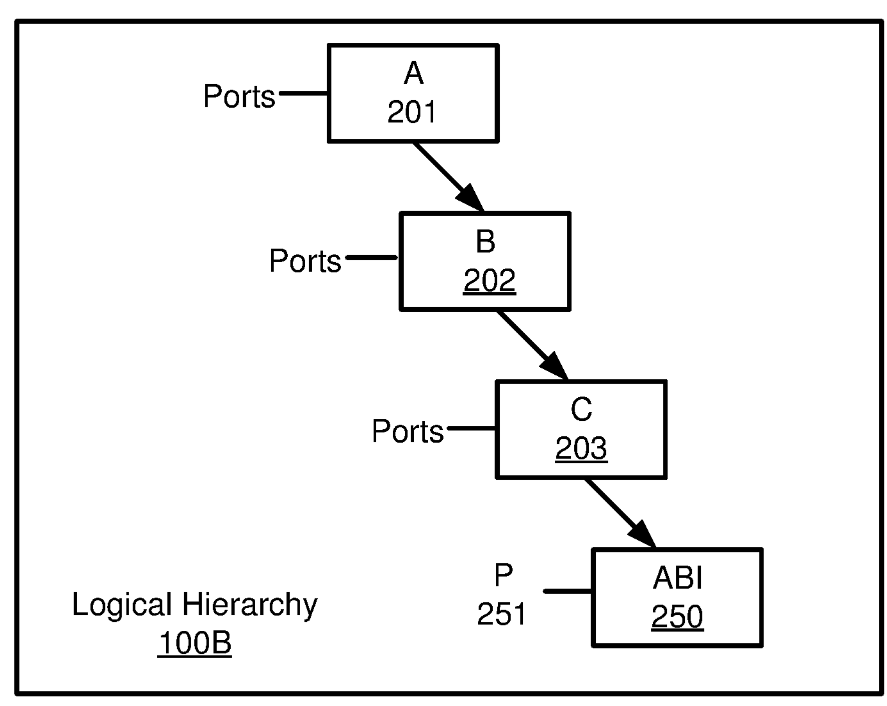
FIG. 2 shows a block diagram where hierarchy manipulation has changed some portions of the logical hierarchy in creating the physical hierarchy.
Figure 2:
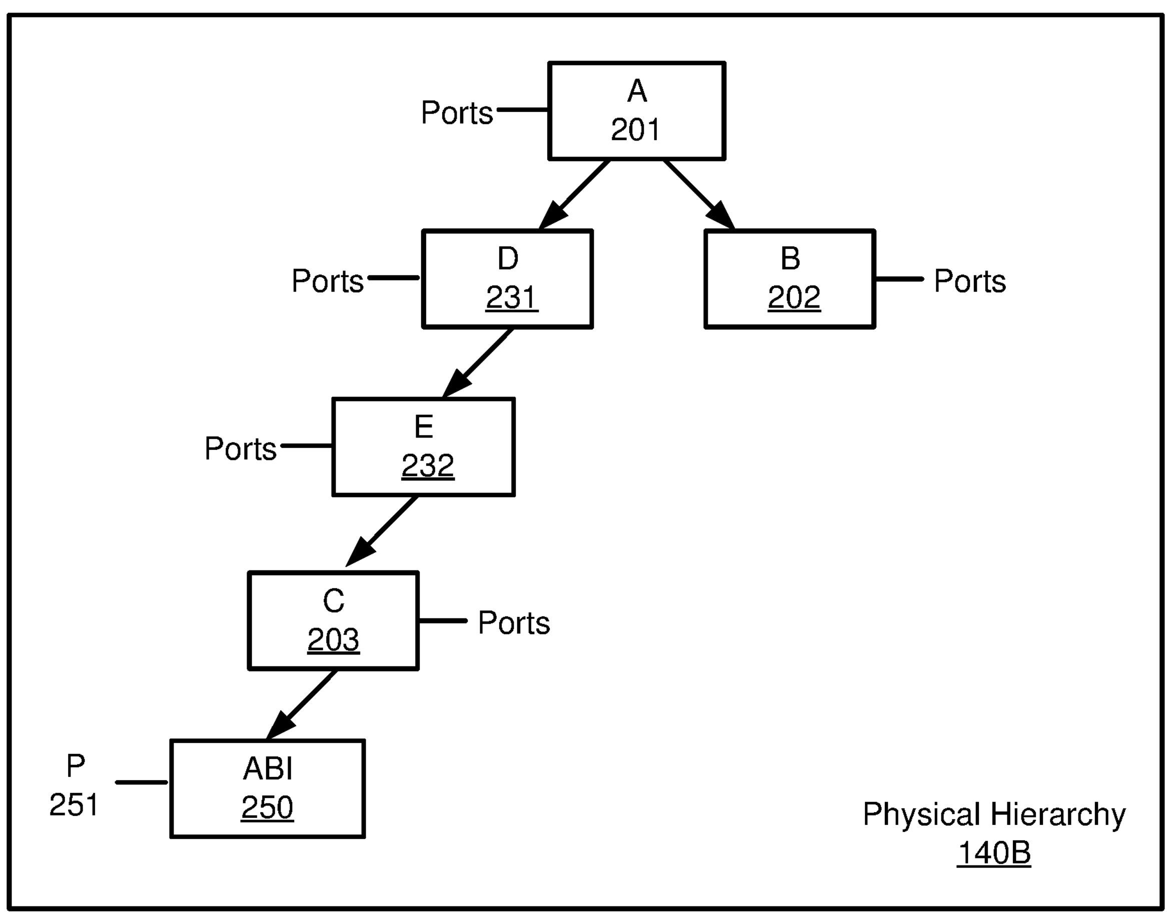
Figure 3:
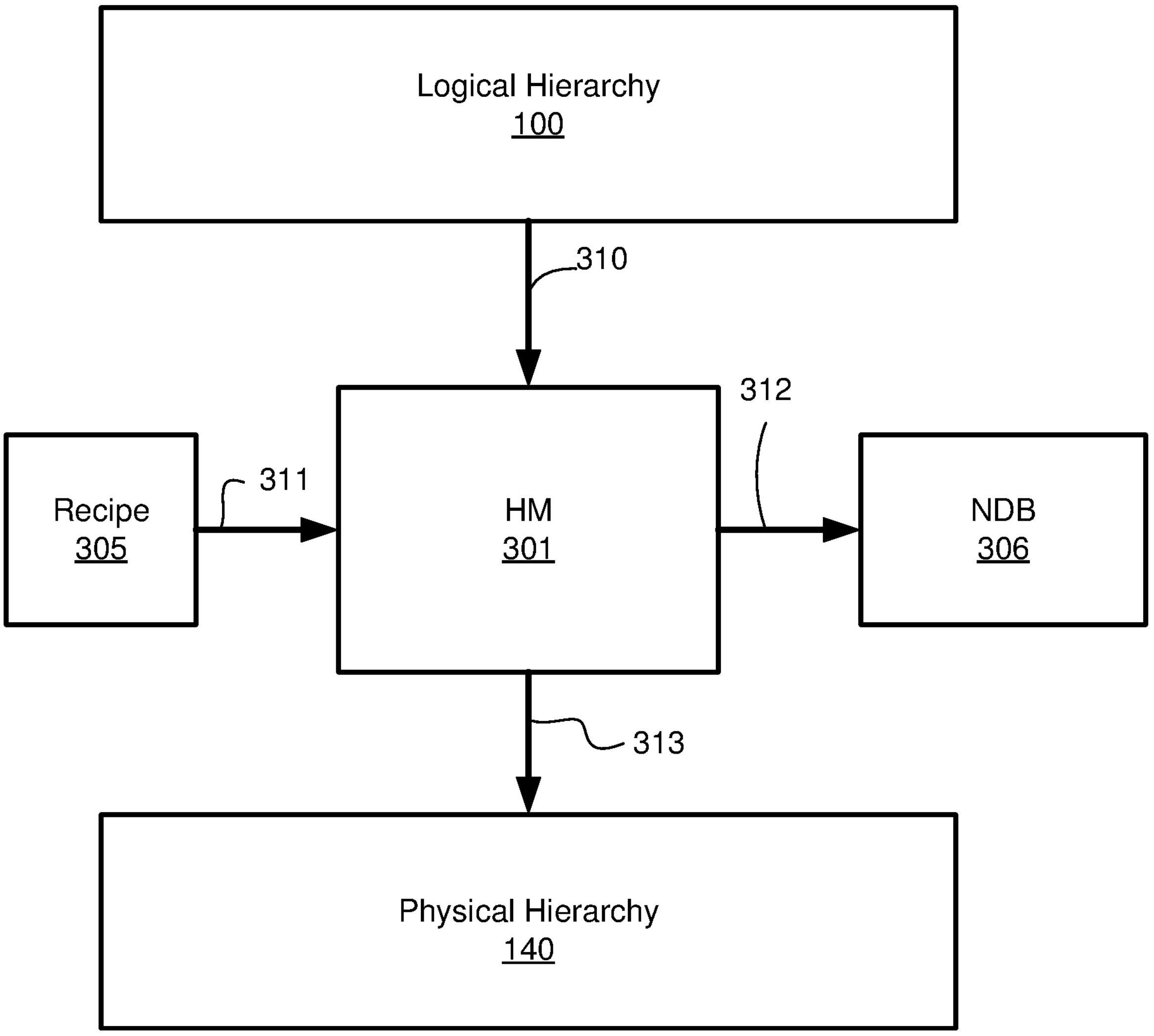
FIG. 3 shows a high level diagram of where the hierarchy manipulation process uses a recipe and the logical hierarchy to create a naming database and a physical hierarchy.

Having reference now to FIGS. 1, 2, and 3, a description of the process is made.

Figure 4:
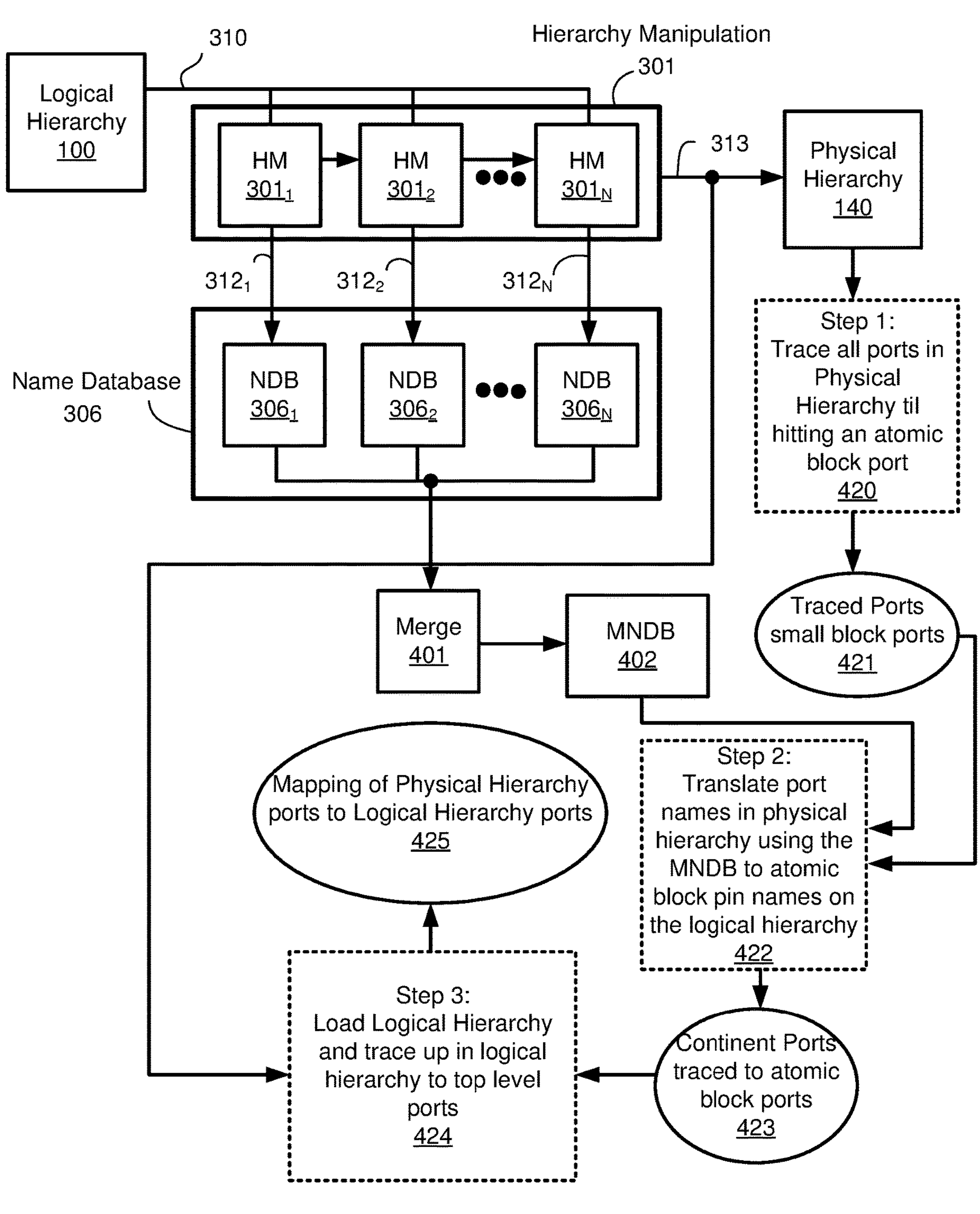
FIG. 4 shows a flow diagram from data structures in the three step process.

FIG. 3 is a high-level drawing showing logical hierarchy 100 which is read by a hierarchy manipulation HM 301 via signal 310. HM 301 also uses controls in recipe 305 via signal 311. HM 301 outputs to a NDB 306 via signal 312 and physical hierarchy 140 via signal 313. Signal 313 is also shown in FIG. 4 going to a block 430. Reference 100 is a general term for a logical hierarchy. Similarly, reference 140 is a general term for a physical hierarchy. Particular logical hierarchies may be identified as, e.g., logical hierarchy 100A or logical hierarchy 100B. Likewise, particular physical hierarchies may be identified as, e.g., physical hierarchy 140A or physical hierarchy 140B.

As an example, refer now to FIG. 2. Logical hierarchy 100B has an atomic block instance ABI 250, which is an instance of an atomic block entity which may be called entity atomic_block1. ABI 250 is instantiated under an instantiation of an entity C, shown as C 203. Likewise, an entity B is instantiated as B 202 under an instantiation of an entity A shown as A 201. Note that A 201, B 202, C 203 all have "ports" which are input and output ports of each block. These ports are included only to show that A 201, B 202, and C 203 in general have inputs and outputs, which will be readily understood. ABI 250, which is an atomic block, has a referenced port, P 251. ABI 250's port P 251 is referenced for explanation below.

Now that A 201, B 202, C 203, and ABI 250 have been introduced, these will now be simplified for easier reading by eliminating the reference numerals. That is, A 201, B 202, C 203, and ABI 250 will be called, respectively, A, B, C, and ABI. Now consider the following set of instructions in recipe 305 (for this example). The recipe 305 commands for hierarchy manipulation can be manually entered by designers or generated by EDA (Engineering Design Automation) tools. For example, HM 301 can take many logical units that closely communicate with each other, flatten them to atomic blocks, and then rearrange the atomic blocks in physical units in physical hierarchy 140. Top level blocks in physical hierarchy 140 are called "continents" herein.

1. Create entity_D.
2. Instantiate entity_D as D 231 in A. (D 231 hereinafter simply called "D").
3. Create entity_E.
4. Instantiate entity_E as E 232 in D. (E 232 hereinafter simply called "E").
5. Move C from (A.B) to (A.D.E). Connections are moved by creating/destroying ports and signals in A, B, D, and E such that the logic function and connectivity of V are maintained.

From the above example, for a switching activity on port P 251 on ABI in physical hierarchy 140B, NDB 306 is used to translate A.B.C.ABI port 251 in logical hierarchy 100B to A.D.E.ABI port P 251 in physical hierarchy 140B and the simulation done on the logical hierarchy 100B is translated to the correct port in the physical hierarchy 140B. Given that the switching activity on port P 251 of ABI from the simulation done using logical hierarchy 100B is now known in physical hierarchy 140B, and a power estimation of power dissipated in ABI that is better than a power estimation using the logical hierarchy because more information about ABI's location and interconnect can be used.

If the physical block of interest for power estimation is an atomic block (latch or combinatorial logic, e.g.) then only NDB 306 from the HM 301 and the ports are required.

Summarizing the above, if a block exists in both logical hierarchy 100 and physical hierarchy 140, which is the case of atomic blocks, ABI in the example of FIG. 2, the translation can be done using NDB 306 for the particular hierarchy manipulation HM 301.

With reference now to FIG. 1, logical hierarchy 100A comprises the following units.

U1 105 comprises blocks C1 115, C2 116, C3 117 and C4 118. C4 118 shows an exemplary port C4_P 170. For simplicity, U1 105, blocks C1 115, C2 116, C3 117, and C4 118 will be referred to as U1, C1, C2, C3, and C4. A "block" may be an atomic_block or may have additional blocks instantiated within a particular block.

Unit U2 106 comprises blocks B1 125, B2 126, B3 127, and B4 128. B4_P 175 is a port on B4 128. B4_P 175 connects with U2 106 port U2 P2 172 to TSIG 180. TSIG 180 connects to Port C4_P 170 on block C4 118. For simplicity, U2 106, blocks B1 125, B2 126, B3 127, and B4 128 will be referred to as U2, B1, B2, B3, and B4.

U3 107 comprises A1 135, A2 136, and A3 137. As above, U3 107, A1 135, A2 136, and A3 137 will be hereinafter referred to as U3, A1, A2, and A3.

Largest blocks in physical hierarchy 100 are herein called "continents", including Con1 155, Con2 156, Con3 157, and Con4 158, hereinafter called Con1, Con2, Con3, and Con4. In this example, there are more "continents" in physical hierarchy 140A than "units" in logical hierarchy 100A.

Con1 comprises blocks C1, C2, and C3 which are the same as the corresponding blocks in U1. C4 has been moved out of U1 into Con3.

Con2 comprises blocks B2, B3, and B4. B1 has moved to Con3.

Con3 comprises blocks C4, A1, and B1.

Con4 comprises blocks A2 and A3.

Port B4_P 175 on block B4 connects to Con2_P2 177. Connection TS2 182 connects to Con2_P2 177 and Con1_P2 176. Con1_P2 176 goes to Con1_P 178, which, in turn, connects to TS1 181 and on to C4_P 170 on C4. For simplicity, B4_P 175 will be called B4_P; Con2_P2 177 as Con2_P2; TS2 182 as TS2; and Con1_P2 176 as Con1_P2.

Step 1: For every port on a physical hierarchy node, trace its connection forward going through wrappers until an atomic block port or a port on the top level of the physical hierarchy is reached. In FIG. 1, starting with Con1 port Con1_P will trace as follows.

1. Con1.Con1 P2→
2. TS2→
3. Con2.Con2 P2→
4. Con2.B4 port B4_P
5. In the example of FIG. 1, B4 is assumed to be an atomic block, and the process moves on to Step 2.

Step 2: name database NDB 306 can, for any module that exists in both hierarchies, which is the case of atomic blocks, take the path in one hierarchy and map it to the other hierarchy. For the atomic block ports in physical hierarchy 140A we need to translate using NDB 306, to ports on logical hierarchy 100A, so U2.B4.B4_P will exist, and we are done.

For many high level simulation environments, such as cycle simulation or emulation, the hierarchy is flattened and the top level facilities switching activities are recorded. For this we need to move to step 3 of the method.

It will be understood that the connection between C4_P and B4_P in physical hierarchy 140A, TS1 181 and TS2 182 may be routed for wiring and congestion purposes and may not go through Con1 at all. TS1 181 and TS2 182 are shown as dotted lines to emphasize that TS1 181 and TS2 182 routing may not physically be routed through Con1 155.

A step 3 is required when interconnection between C4_P and B4_P cannot be determined. For example, if the switching activity is done with a high-level simulator, herein called "cycle simulation" as may be done if U1 is, for simulation, embodied as a VHDL block instead of atomic blocks C1 115, C2 116, C3 117, and C4 118. In such simulations, switching activity is recorded on signals; in this case, on TSIG 180.

For cases where step 3 is required, we will now take logical hierarchy 100A, and trace up until we hit a top level port or a facility that is not a port and use its switching activity. So, for the example above:

1. U2.B4.B4_P→
2. U2.U2_P2→
3. U2.TSIG

The preceding gives a description where there is only one HM (hierarchy manipulation) step between the logical hierarchy 100 and the physical hierarchy 140. In most cases the HM can comprise multiple hierarchy manipulation actions. This occurs, for example, where components inside units are also hierarchy manipulated with later components across units manipulated.

In FIG. 4, logical hierarchy 100 and physical hierarchy 140 are shown for a design having a HM 301 comprising multiple hierarchy manipulation actions. Logical hierarchy 100 and physical hierarchy 140 are top level hierarchies on the chip.

Hierarchy manipulation 301 comprises hierarchy manipulation actions HM $\mathbf{301}_1$, HM $\mathbf{301}_2$, and HM $\mathbf{301}_N$, where the three dots represent other hierarchy manipulation actions between HM $\mathbf{301}_2$ and HM $\mathbf{301}_N$, each of which result in a NDB 306 (NDB $\mathbf{306}_1$, $\mathbf{306}_2$, and $\mathbf{306}_N$) via signals $\mathbf{312}_1$, $\mathbf{312}_2$, and $\mathbf{312}_N$ respectively. "N" is a number dictated by the depth and breadth of the design hierarchy and at what levels the hierarchy manipulation is run. For example, in an exemplary project, HM 301 is run at some or all unit levels and then at a higher level where units are grouped together at the chip level.

Output of HM $\mathbf{301}_{N-1}$ feeds into HM $\mathbf{301}_N$ to refine HM 301 further. Because HM 301 can be done in many separate and multiple actions, NDB $\mathbf{306}_1$ to NDB $\mathbf{306}_N$ from all the HM 301 actions are merged by merge 401 into merged database MNDB 402 to provide end-to-end translation between logical hierarchy 100 and physical hierarchy 140.

Mapping of ports in logical hierarchy 100 to ports in physical hierarchy 140 is done in a three step process, shown in the flow blocks outlined with dotted lines in FIG. 4.

In Step 1 420, tracing ports in physical hierarchy until hitting an atomic block port is done, producing traced ports small block ports 421 data file.

In Step 2 422, traced ports from Step 421 are translated from the physical hierarchy using MNDB 402 to atomic block port names on logical hierarchy 100, outputting a file 423 continent ports traced to atomic block ports.

Step 3 424 is required when switching activity is only recorded on high level units (e.g., a VHDL U1 explained earlier). In this case, switching activity from ports of the logical unit is traced from U2.B4.B4_P to U2.U2_P2 and switching activity on TSIG 180 is used for U2.B4.B4_P power calculation purposes.

Figure 5:
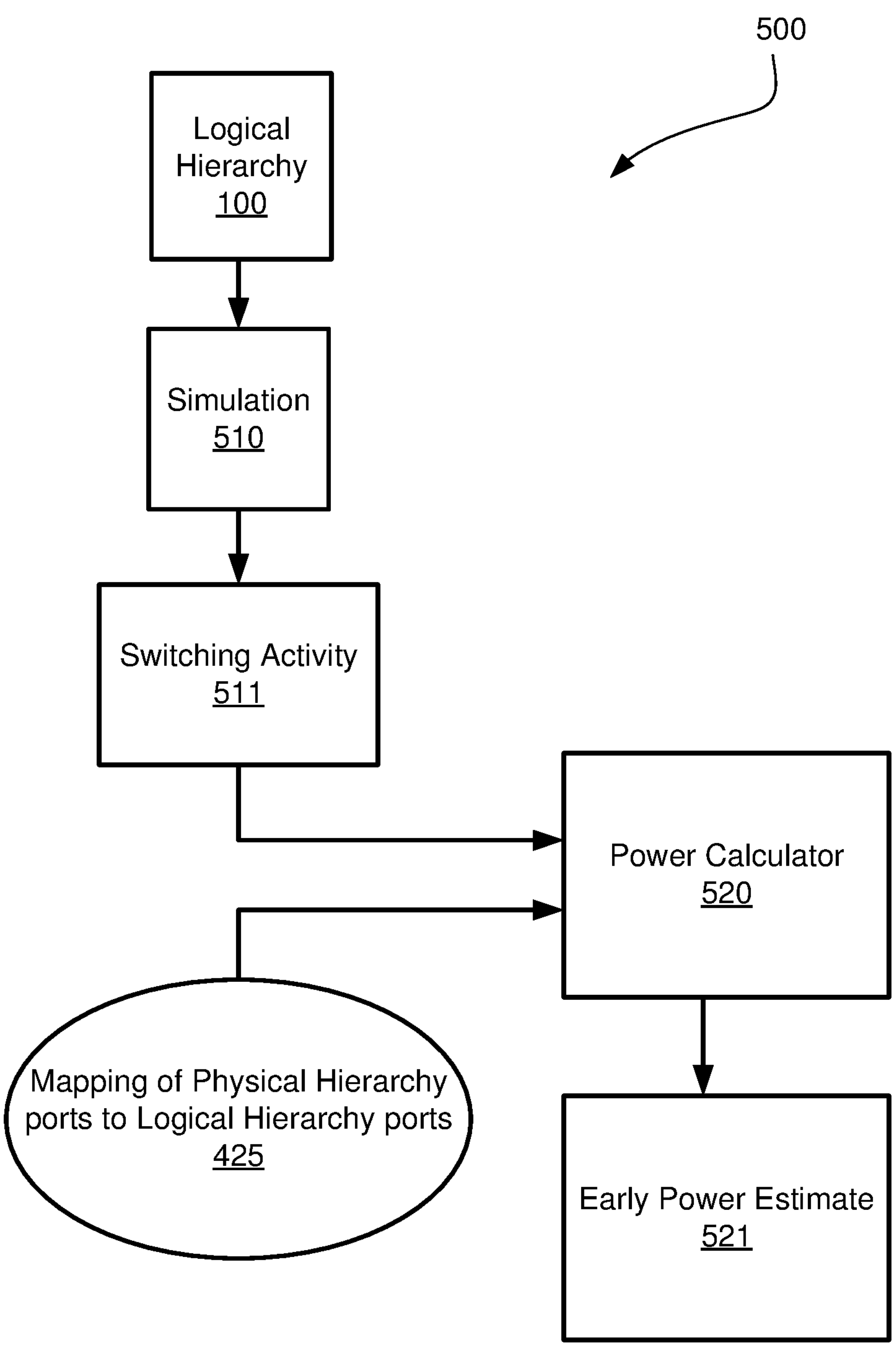
FIG. 5 shows a flow diagram of the method.

FIG. 5 is a flow diagram of a method 500 showing simulation done on logical hierarchy 100. Logical hierarchy 100 is simulated by simulation 510 to apply switching activity on input and output ports of logical hierarchy 100 ports. Switching activity is recorded on logical hierarchy ports in step 511. Switching activity from step 511 and mapping of physical hierarchy 140 ports to logical hierarchy 100 ports by step 425 are input to power calculator 520. Power calculator 520 receives switching activity on ports from step 511 and uses input from step 425 to compute power dissipation on the chip being designed. More detail of step 425 is given in method 600 in FIG. 6.

Power calculation is done in a conventional manner given switching activity on physical hierarchy 140 ports and is output for the designer in step 521. At this stage of chip design, as noted earlier, the power calculated is an estimate as final placement and wiring has not been done yet. However, since blocks and signals may have been replicated, deleted, or merged during hierarchy manipulation, the estimate has more information, and the power estimate is better than a power estimate based only on the simulation of the logic hierarchy. A better estimate provides the designer time to respond to power problems that may not have been identified in a power calculation based on simulation on the logic hierarchy, without the additional information provided by the mapping of logical to physical ports in the design.

The power estimate is output to a designer for analysis as to whether the power value calculated is acceptable for the design.

Figure 6:
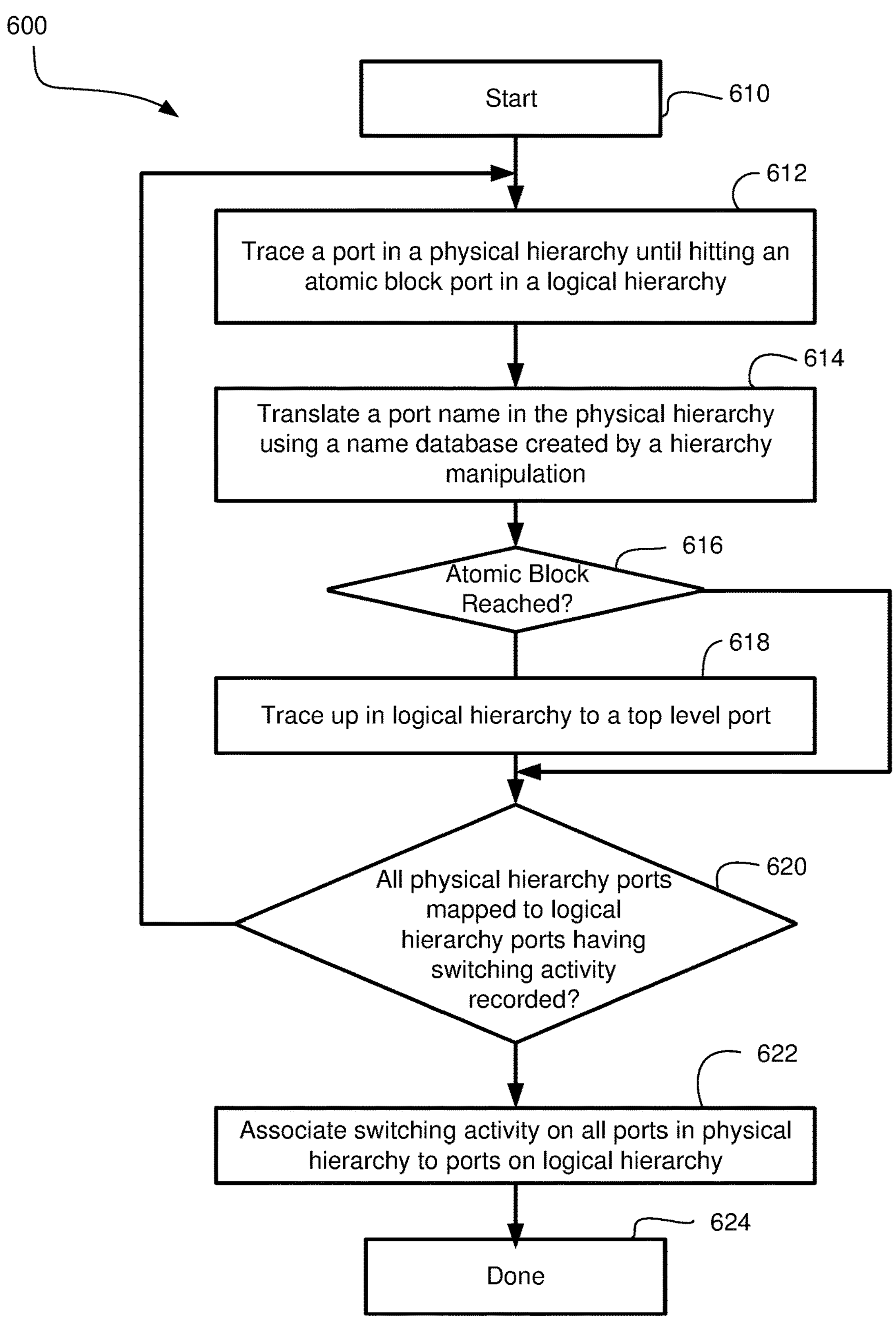
FIG. 6 shows a more detailed diagram of the method, including actions needed for a hierarchy design.

FIG. 6 shows method 600, explaining step 425 in more detail needed for a hierarchy design. Method 600 begins with block 610.

In block 612, a port in a physical hierarchy is traced until hitting an atomic block port in a logical hierarchy.

In block 614, the port in the physical hierarchy is translated using a name database created by a hierarchy manipulation.

In block 616 a check is made to see if the tracing has reached an atomic block. If "yes", control passes to block 620. If "no", in block 618 the port is traced up in the logical hierarchy to a top level port.

In block 620, a check is made to see if all physical hierarchy ports have been mapped to ports in the logical hierarchy. If so, control passes to block 622. If not, control passes to block 612.

In block 622, switching activity on all ports in the physical hierarchy are associated with ports on the logical hierarchy.

Block 624 ends method 600.

What is claimed is:

1. A method of providing an early power estimate on a hierarchy designed chip after simulation on a logical hierarchy and hierarchy manipulation and prior to final placement and wiring of the chip, the method comprising:
- simulating the logical hierarchy for functional correctness;
- recording switching activity on all ports in the logical hierarchy;
- creating a physical hierarchy,
- wherein creating the physical hierarchy comprises:

creating one or more name data bases (NDBs) by the hierarchy manipulation, each name database recording transformations applied in creating the physical hierarchy, using a merged NDB, tracing ports in the physical hierarchy until an atomic block is encountered;

mapping all ports in the physical hierarchy to corresponding ports in the logical hierarchy;

calculating power on the chip using the switching activity on the ports in the logical hierarchy mapped to ports in the physical hierarchy; and outputting the result of the power calculation.

2. The method of claim 1, the creating a physical hierarchy comprises:

creating one or more recipes for a hierarchy manipulation, wherein each recipe comprises instructions for generating the physical hierarchy, wherein the recipes are manually generated by engineering design automation (EDA) tools.

3. The method of claim 2, further comprising: when two or more NDBs have been created, merging the two or more NDBs into the merged NDB; and using a single NDB as the merged NDB.

4. The method of claim 1, translating the traced ports to atomic block pin names on the logical hierarchy.

5. The method of claim 4, further comprising: if the tracing does not encounter an atomic block, tracing to a port in a higher level of the logical hierarchy.

6. The method of claim 5, further comprising: using the switching activity from simulation of the logical hierarchy, mapping the switching activity to ports in the physical hierarchy.

7. The method of claim 6, further comprising computing power for the physical hierarchy using the mapped switching activity.

8. The method of claim 7, further comprising outputting the computed power for use by a designer for determining whether the power value is acceptable for the design.

9. A method of mapping ports in a physical hierarchy to ports in a logical hierarchy after simulation of the logical hierarchy and hierarchy manipulation to create the physical hierarchy has been done, the method comprising:

tracing a port in the physical hierarchy until an atomic block port is encountered in the logical hierarchy;

translating a port name in the physical hierarchy, using a name database created by the hierarchy manipulation, to a port name of an atomic block in the logical hierarchy;

when tracing cannot an atomic block port in the logical hierarchy, tracing up in the logical hierarchy to a top level in the logical hierarchy;

iteratively tracing the port and translating the port until all physical hierarchy ports are mapped to ports in the logical hierarchy where switching activity is recorded; and using the mapping of ports from the physical hierarchy to ports in the logical hierarchy, using a switching activity recorded in a simulation to the ports in the physical hierarchy to estimate power.

* * * * *